United States Patent [19]

Shirai et al.

[11] Patent Number: 5,776,662
[45] Date of Patent: Jul. 7, 1998

[54] METHOD FOR FABRICATING A CHIP CARRIER WITH MIGRATION BARRIER, AND RESULATING CHIP CARRIER

[75] Inventors: Masaharu Shirai, Kusatsu; Yutaka Tsukada, Shiga-ken, both of Japan

[73] Assignee: International Business Machines Corporation, Armonk, N.Y.

[21] Appl. No.: 647,513

[22] Filed: May 14, 1996

[30] Foreign Application Priority Data

Aug. 8, 1995 [JP] Japan ................... 7-201985

[51] Int. Cl.[6] ................... G03C 5/00; H05K 7/00
[52] U.S. Cl. ................... 430/313; 430/317; 430/319; 361/739; 361/746; 361/750
[58] Field of Search ................... 430/313, 317, 430/319; 361/750, 739, 746

[56] References Cited

U.S. PATENT DOCUMENTS 4,377,619  3/1983  Schonhorn et al. ................... 428/333
5,460,858  10/1995  Yamada et al. ................... 427/510

FOREIGN PATENT DOCUMENTS 8259912  10/1996  Japan .

*Primary Examiner*—Janet C. Baxter
*Assistant Examiner*—Rosemary Ashton
*Attorney, Agent, or Firm*—Pollock, Vande Sande & Priddy

[57] ABSTRACT

To inhibit the migration of conductive layers in a multilayer chip carrier, e.g., a multilayer printed circuit board, an optically cured layer 13, which is an anti-migration layer, is formed in an insulating layer 12 located between a first conductive layer 8 and a second conductive layer 6. Such a structure is formed by thinning, e.g., grinding down, a first insulating layer, leaving about half the thickness of the first insulating layer. This first insulating layer is selectively optically irradiated with actinic radiation to form an optically cured layer. Via holes are etched into the non-irradiated portions of the first insulating layer. Thereafter, a second insulating layer is formed on the first insulating layer, and it too is selectively optically irradiated with actinic radiation. Via holes are etched into the non-irradiated portions of the second insulating layer, directly over the via holes in the first insulating layer, and the second insulating layer is also thinned.

18 Claims, 3 Drawing Sheets

METHOD FOR FABRICATING A CHIP CARRIER WITH MIGRATION BARRIER, AND RESULATING CHIP CARRIER

BACKGROUND OF THE INVENTION

1. Field of the Invention

The present invention relates generally to a method for fabricating a multilayer chip carrier, such as a multilayer printed circuit board (PCB), and to the resulting multilayer chip carrier. The present invention relates particularly to a method for fabricating a surface laminar circuit (SLC) type, multilayer PCB having enhanced migration resistance and to the resulting SLC type PCB.

2. Description of the Related Art

Relatively complex electronic circuits are formed by mounting semiconductor integrated circuit devices (herein referred to as chips), resistors, capacitors, etc., onto a polymeric or ceramic multilayer chip carrier, such as a multilayer printed circuit (PCB). The structure of, for example, such a multilayer PCB generally comprises a plurality of electrically conductive wiring layers separated by electrically insulating layers, with the wiring layers being electrically interconnected by, for example, plated via holes.

In general, a heat resistant board material, such as a phenolic-resin impregnated paper board material, a glass epoxy board material, insulated metal board material, and a flexible printed board material, is used as the substrate on which the various layers of a multilayer PCB are formed. In connection with the wiring layers, a highly conductive metal such as copper or silver is generally used. These metals are deposited by electroless plating or electroplating, or deposited onto an insulating layer by screen printing using a conductive paste. The insulating layers often comprise an optically curable polymer, such as, for example, acrylic resins (e.g., polyacrylate), or vinyl alcoholic resins (e.g., cinnamic ester of polyvinyl alcohol).

A significant problem associated with the above-described chip carriers is the occurrence of migration. Migration is a phenomenon where metallic ions in the conductive layers of a chip carrier, e.g., a multilayer PCB, diffuse into the insulating layers, thereby forming conductive paths between the conductive layers through the insulating layers. Because migration is a diffusion phenomenon, the time period over which migration occurs is affected by the diffusion coefficient of the conductive metal in the insulating material, the thickness of the insulating layer, and the ambient conditions in which the PCB is used, especially temperature.

Heretofore, migration has been prevented by increasing the distance between wiring layers, or by applying a carbon paste, which is chemically stable and resistant to migration, to the wiring layers. However, the former procedure precludes densification of wiring layers and increased integration of chips. On the other hand, the latter procedure complicates processing. Therefore, these prior techniques are disadvantageous.

If there are pinholes in an insulating layer, these pinholes provide paths which accelerate the occurrence of migration. As a result, some prior techniques attempt to prevent conductive layers from contacting those insulating layers which contain a large number of pinholes. For example, in PUPAJP5-243713, in order to prevent migration from a conductive layer formed by a conductive paste, a resist material is densely applied onto the conductive layer, so that pinholes, which are the paths of migration, are not formed in contact with the conductive layer. Also in PUPA-JP 1-175295, a method for preventing migration in PCBs is disclosed. This method comprises the steps of: (1) applying a liquid resist between circuits after forming circuit patterns; and (2) depositing a photosensitive dry film onto the structure formed in step (1). In step (1), the wiring layer is planarized to enable the dry film to be evenly deposited and in step (2) a film free of pinholes is deposited so that migration is prevented. By this method, however, existing processes must be modified to a large extent, reducing throughput.

PCBs of the surface laminar circuit (SLC) type are also subject to migration. In an SLC type PCB, insulating and conductive layers are built up one after another while forming wiring patterns in the conductive layers. At the same time, wiring patterns in the conductive layers are electrically interconnected by forming via holes at specific locations in the insulating layers, and by plating a conductive material onto the surfaces of the via holes. The conventional process for manufacturing an SLC type PCB is shown in FIGS. 1–3. As shown in FIG. 1, a photosensitive epoxy resin is deposited onto a substrate 1 as an insulating layer 2, and then the surface of the layer is selectively exposed to actinic radiation in a specific pattern to form an optically cured layer 3. After the layer 3 is developed, the layer 2 is etched using the developed layer 3 as an etch mask to form a via hole 4. This via hole 4 is formed over a conductive layer 5 to achieve electrical contact with a subsequently formed, overlying conductive layer (not shown in FIG. 2). Next, the optically cured layer 3 and a part of the insulating layer 2 are removed as shown in FIG. 2. The removal of the optically cured layer 3 is generally performed by a mechanical method such as grinding. In FIG. 2, the part which has been removed is shown in dotted lines. Finally, as shown in FIG. 3, the entire structure is subjected to copper plating 6. As a result, the conductive layer 5 already formed is electrically connected to the overlying conductive layer 6 through the copper plating 7 formed on the walls of via hole 4. Although not shown, after patterning the copper plated layer 6 into a desired pattern, an insulating layer is applied and a via hole is formed in the insulating layer in the same manner as in FIG. 1 in order to achieve an electrical connection. By repeating these steps and building up insulating layers, with each having a via hole, and patterned conductive layers, an SLC type PCB is formed.

In SLC type PCBs, migration from conductive layers may also cause a critical problem. As shown in FIG. 3, if migration 9 occurs causing a short circuit between the conductive layer 8 and overlying conductive layer 6, this unwanted electrical connection will cause erroneous operations. Since the insulating layer is as thin as 30–60 micrometers, such migration in the thickness direction (the z direction) frequently occurs. Therefore, the prevention of migration in the z direction is essential for the improvement of product life of SLC type PCBs.

SUMMARY OF THE INVENTION

It is an object of the present invention to prevent migration from conductive layers in multilayer chip carriers, e.g., multilayer PCBs, to thereby increase the life of such multilayer chip carriers.

It is another object of the present invention to prevent migration in multilayer chip carriers, e.g., multilayer PCBs, without complicating manufacturing processes or structures.

It is still another object of the present invention to prevent migration in multilayer chip carriers, e.g., multilayer PCBs, while largely avoiding changes to conventional processes and while avoiding the use of special materials in corresponding structures.

The inventors of the present invention have discovered that resistance to migration in the z direction is significantly increased when an optically cured layer is formed between conductive layers formed on opposite sides of an insulation layer.

The present invention, in utilizing the above-mentioned discovery, provides an SLC type PCB having an optically cured layer, which serves as an anti-migration layer, between a first conductive layer and a second conductive layer. Such an SLC type PCB is fabricated by: (1) forming a photosensitive insulating layer having a thickness about half the thickness of a conventional insulating layer on a substrate; (2) selectively exposing and developing the insulating layer, and then using the optically cured layer to etch the insulating layer so as to form at least one via hole in the insulating layer; and (3) forming another insulating layer of reduced thickness on the first insulating layer and further forming one or more via holes in the second insulating layer which are aligned with the via holes in the first insulating layer.

DETAILED DESCRIPTION OF THE PREFERRED EMBODIMENT(S)

Figure 4:
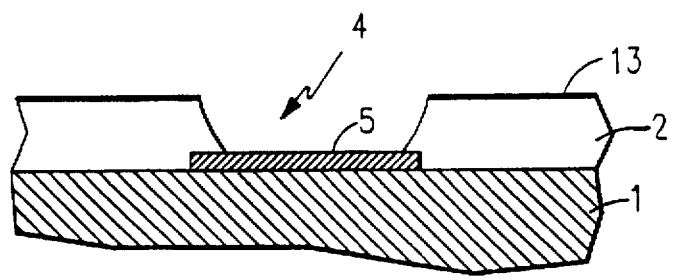
FIGS. 4-8 depict the inventive process for fabricating an SLC type PCB having a migration barrier.

The manufacturing process for fabricating an SLC type PCB having a migration barrier, according to the present invention, is shown in FIGS. 4-8. In accordance with the inventive process, and as shown in FIG. 4, an insulating layer 2 is formed on a substrate 1, and at least one via hole 4 is formed in the insulating layer 2. The insulating layer 2 is thinner than a conventional insulating layer as a result of thinning, e.g., mechanical grinding, having a thickness almost half the thickness normally required for such a layer. According to a preferred embodiment, the thickness of the insulating layer 2 is about 15-30 micrometers, but this thickness is not an essential factor of the present invention. Unlike prior techniques, the thin insulating layer 2 is optically cured, preferable by UV light, at this point to form an optically cured layer 13 on the surface of layer 2. Exposure is preferably performed on the entire insulating layer 2 except the portion assigned to the at least one via hole 4.

Figure 5:
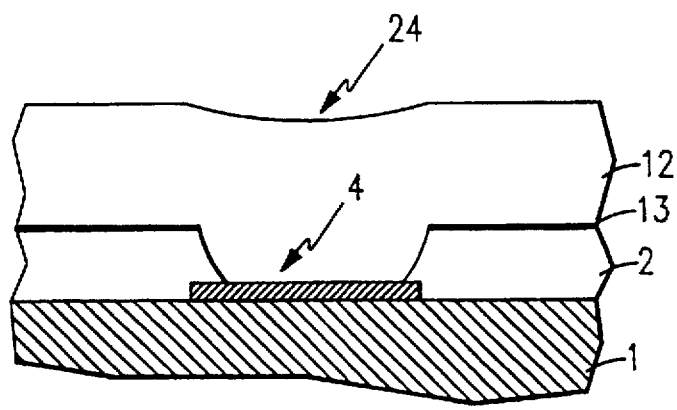

Next, as FIG. 5 shows, an insulating layer 12 is formed on the optically cured layer 13. A concave portion 24 is formed immediately above the at least one via hole 4. This is because the shape of the via hole 4 is reflected in the shape of the insulating layer 12.

Figure 6:
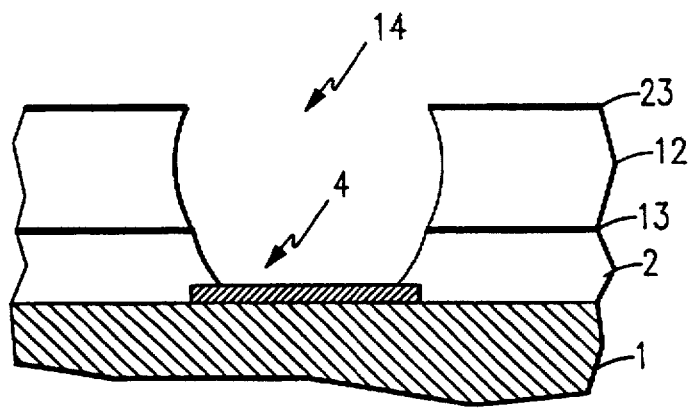

As FIG. 6 shows, the insulating layer 12 is subjected to pattern exposure to form an optically cured layer 23. Optical curing is not performed on the location immediately above the at least one via hole 4. Consequently, as shown in FIG. 6, via hole(s) 14 connected to the via hole(s) 4 is (are) then readily formed by developing the layer 23.

Figure 1:
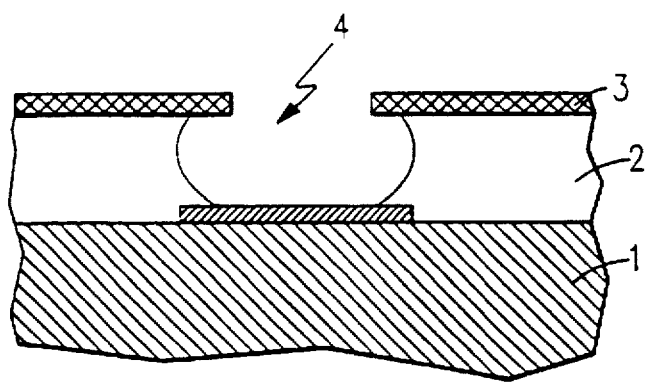
FIGS. 1-3 depict the conventional process for fabricating an SLC type PCB.
Figure 2:
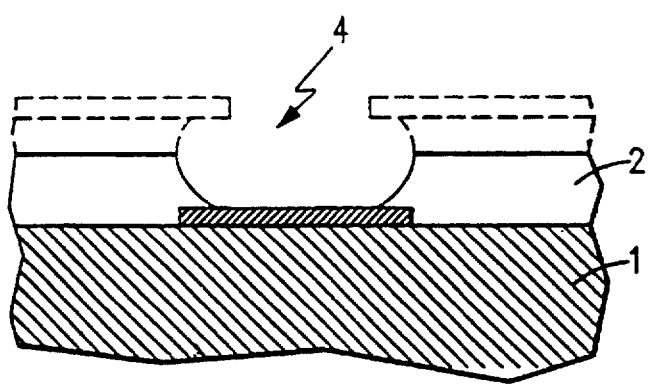
Figure 3:
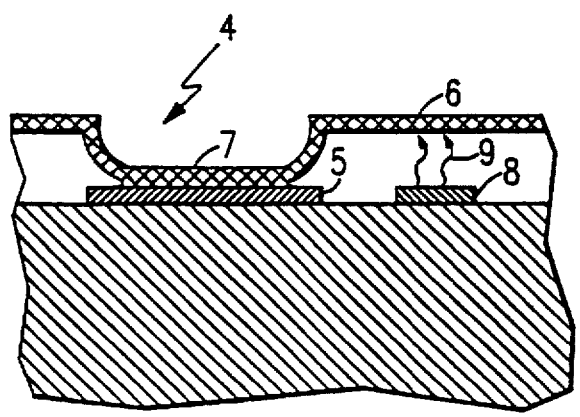
Figure 7:
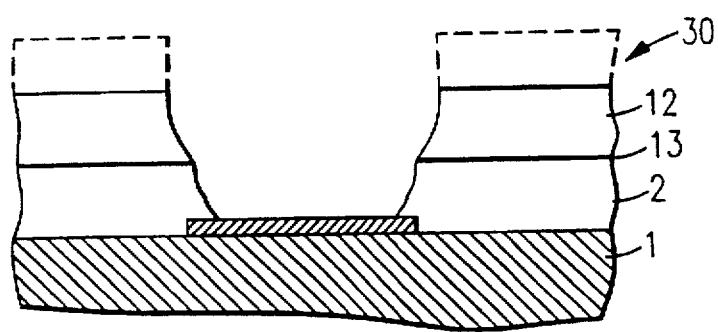
Figure 8:
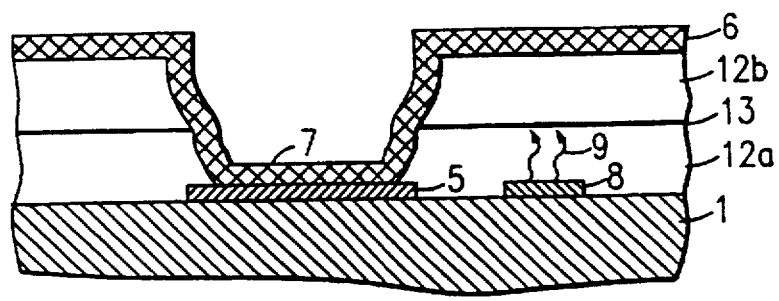

Next, as shown in FIG. 7, the optically cured layer 23 and a part of the insulating layer 12 are thinned, e.g., mechanically ground, to a desired thickness. According to the preferred embodiment, the total thickness of the insulating layers ranges from about 30 to about 60 micrometers. In FIG. 7, the part to be ground off 30 is shown in dotted lines. Finally, as FIG. 8 shows, a copper plated layer 6 is formed. As a result, the cross section of a multilayer PCB, having the same functions as one formed according to conventional methods shown in FIG. 3, is formed. However, the present invention includes an optically cured layer 13 between conductive layers 8 and 6, which serves as an anti-migration layer.

In the above method, although at least one via hole is formed at a specific location as shown in FIG. 4, this may be omitted. For example, after an optically cured layer 13 is formed in FIG. 4, an insulating material 12 may immediately be applied and then the via hole(s) 14 may be formed. In this case, during the formation of the optically cured layer, the portion to become a via hole(s) in the latter process must be masked in order not to be cured. This is because the formation of a via hole(s) in the optically cured portion would be more difficult.

The concept of the present invention is as follows. As shown in FIG. 8, the breakdown of the circuit is caused by migration, which results in the formation of a short circuit between the conductive layer 8 and the overlying conductive layer 6. According to the present invention, however, a highly crosslinked, dense, optically cured layer 13 is formed directly in the migration path in the z direction, which serves as a barrier to migration in the z direction. That is, although migration occurs as usual in the insulating layer 12a located on the lower side of the optically cured layer 13, migration is inhibited or interfered with by the optically cured layer 13, resulting in the absence of migration in the insulating layer 12b. Therefore, the formation of a short circuit between the conductor 8 and the conductor 6 is prevented.

The prevention of migration by forming an optically cured layer as disclosed in the present invention may be viewed as follows. Since migration is a phenomenon in which metallic ions move between molecules existing in an insulating layer, this movement of ions must be interfered with by a certain means. When a resin is cured by an optical reaction, the resin crosslinks to form a network structure, through which metallic ions do not pass easily. Therefore, if such a region is formed, through which metallic ions have difficulty diffusing, one object of the present invention is achieved. Although optical curing is used in the above embodiment, thermal curing may also be used. The diffusion coefficient of metallic ions in such a cured layer is less than one-tenth the diffusion coefficient of metallic ions in a conventional insulating layer which has not been cured. In a broad sense, therefore, the present invention relates to a method for preventing migration by forming a layer having a reduced diffusion coefficient for metallic ions in an insulating layer.

While the inventive fabrication method has been discussed within the context of a multilayer, SLC type PCB, it should be obvious that it is also applicable to multilayer printed circuit cards and organic laminate chip carriers, such as single chip module laminates (SCM-Ls) and multi-chip module laminates (MCM-Ls).

EXAMPLE

Difference in migration between the presence and absence of an optically cured layer was checked by the following experiments. After forming a comb-shaped copper pattern on an FR-4 board, Probimer 52 (sold by Ciba-Geigy) was applied using a curtain coater so that a film about 30 micrometers thick was formed after curing. The film was preliminarily dried, and irradiated by a light of 3000 mj to form an optically cured layer. This optically cured layer had a thickness of 5 micrometers or less. An insulation layer of Probimer 52 was further formed on the optically cured layer under the same process conditions, preliminarily dried, irradiated by a light of 3000 mj, developed to form a via hole, and cured thermally. The surface of the resulting board was ground to form an insulation layer having a thickness of 40 micrometers, treated with permanganate, subjected to copper plating, and patterned to form a copper pattern which covers the entire comb-shaped pattern.

Thus two conductive layers were formed on opposite sides of an insulating layer having a thickness of about 40 micrometers, and the degradation of insulation was observed when voltages of 0.5 V and 0 V were applied to the left and right of the underlying comb-shaped pattern, respectively, under the conditions of 119.8° C. and 85 percent relative humidity. The insulation resistance between the conductive layers was monitored, and the board was judged to have failed the test when the insulation resistance lowered to $10^6$ ohms or less.

As comparative examples, a substrate sample having two conductive layers formed on opposite sides of a conventional insulating layer having the same thickness was used. Table 1 shows cumulative percentage defects (percentage of tested samples which showed migration) after some hours.

TABLE 1

| Time Lapse (H) | Cumulative percent defective (%) | |
|---|---|---|
| | Embodiment | Comparative Example |
| 48 | 0 | 0 |
| 131 | 0 | 0 |
| 152 | 0 | 34 |
| 176 | 0 | 100 |

As shown in table 1, the time lapse until insulation degrades was much longer for the Embodiments having optically cured layers formed in between, and no problems occurred even after the test for 176 hours, when all the Comparative Examples became defective.

In summary, according to the present invention, migration in the thickness direction is prevented. Shortcircuiting between a plurality of conductive layers is also prevented by forming an optically cured layer in an insulating layer on the board. Also, according to the present invention, resistance to migration is improved without using additional elements, and without modifying conventional processing to a large extent or introducing additional processes.

While the invention has been particularly shown and described with reference to preferred embodiments thereof, it will be understood by those skilled in the art that various changes in form and details may be made therein without departing from the spirit and scope of the invention.

What is claimed is:

1. A chip carrier, comprising:
   a substrate;
   a first layer of electrically conductive material overlying said substrate;
   a second layer of electrically conductive material overlying said first layer of electrically conductive material; and
   a layer of electrically insulating material sandwiched between said first and second layers of electrically conductive material, said layer of electrically insulating material including a barrier to metal migration between said first and second layers of electrically conductive material in a z-direction perpendicular to said first and second layers of electrically conductive material.

2. The chip carrier of claim 1, wherein said layer of electrically insulating material has a thickness ranging from about 30 to about 60 micrometers.

3. The chip carrier of claim 1, wherein each of said first and second layers of electrically conductive material is a wiring layer.

4. The chip carrier of claim 1, wherein said first and second layers of electrically conductive material are electrically connected by at least one via hole extending through the thickness of said layer of electrically insulating material.

5. The chip carrier of claim 1, wherein said chip carrier is a printed circuit board.

6. The chip carrier of claim 1, wherein said chip carrier is a printed circuit card.

7. The chip carrier of claim 1, wherein said chip carrier is an organic laminate chip carrier.

8. The chip carrier of claim 1, wherein said barrier has a reduced diffusion coefficient for metal ions.

9. A method for fabricating a chip carrier, comprising the steps of:
   forming a first layer of electrically conductive material on a substrate;
   forming a layer of electrically insulating material on said first layer of electrically conductive material;
   forming a barrier to metal migration in and/or on said layer of electrically insulating material; and
   forming a second layer of electrically conductive material on said layer of electrically insulating material, said barrier preventing metal migration between said first and second layers of electrically conductive material in a z-direction perpendicular to said first and second layers of electrically conductive material.

10. The method of claim 9, wherein said step of forming a layer of electrically insulating material includes the steps of:
   forming a first layer of electrically insulating material on said substrate and said first layer of electrically conductive material;
   forming said barrier in said first layer of electrically insulating material; and
   forming a second layer of electrically insulating material on said first layer of electrically insulating material.

11. The method of claim 9, wherein said chip carrier is a printed circuit board.

12. The method of claim 9, wherein said chip carrier is a printed circuit card.

13. The method of claim 9, wherein said chip carrier is an organic laminate chip carrier.

14. The method of claim 9, wherein said barrier has a reduced diffusion coefficient for metal ions.

15. A chip carrier, comprising:
   a substrate;
   a first layer of electrically conductive material overlying said substrate;
   a second layer of electrically conductive material overlying said first layer of electrically conductive material; and
   a layer of electrically insulating material sandwiched between said first and second layers of electrically conductive material, said layer of electrically insulating material including a barrier to metal migration between said first and second layers of electrically conductive material, said barrier including a layer of barrier material in which a diffusion coefficient for metallic ions is less than that in said layer of electrically insulating material.

16. A chip carrier, comprising:

a substrate;

a first layer of electrically conductive material overlying said substrate;

a second layer of electrically conductive material overlying said first layer of electrically conductive material; and a layer of electrically insulating material sandwiched between said first and second layers of electrically conductive material, said layer of electrically insulating material includes material which is optically and/or thermally curable, said layer of electrically insulating material including a barrier to metal migration between said first and second layers of electrically conductive material, said barrier including a layer of said electrically insulating material that has been optically and/or thermally cured.

17. A method for fabricating a chip carrier, comprising the steps of:

forming a first layer of electrically conductive material on a substrate;

forming a layer of electrically insulating material on said first layer of electrically conductive material, including forming a first layer of electrically insulating material on portions of said substrate not covered by said first layer of electrically conductive material and forming a second layer of electrically insulating material on said first layer of electrically insulating material;

forming a barrier to metal migration in said first layer of electrically conductive material, said formation of said barrier including reducing a diffusion coefficient for metallic ions in a portion of said first layer of electrically insulating material; and forming a second layer of electrically conductive material on said layer of electrically insulating material, said barrier preventing metal migration between said layers of electrically insulating material in a z-direction perpendicular to said first and second layers of electrically conductive material.

18. A method for fabricating a chip carrier, comprising the steps of:

forming a first layer of electrically conductive material on a substrate;

forming a layer of electrically insulating material on said first layer of electrically conductive material, including:

forming a first layer of electrically insulating material including material that is optically and/or thermally curable on portions of said substrate not covered by said first layer of electrically conductive material, and forming a second layer of electrically insulating material on said first layer of electrically insulating material;

forming a barrier to metal migration in said first layer of electrically insulating material by optically curing a portion of said first layer of electrically insulating material; and forming a second layer of electrically conductive material on said layer of electrically insulating material, said barrier preventing metal migration between said layers of electrically insulating material in a z-direction perpendicular to said first and second layers of electrically conductive material.

* * * * *

UNITED STATES PATENT AND TRADEMARK OFFICE
CERTIFICATE OF CORRECTION

PATENT NO. : 5,776,662
DATED : July 7, 1998
INVENTOR(S) : Masaharu Shirai and Yutaka Tsukada It is certified that error appears in the above-identified patent and that said Letters Patent is hereby corrected as shown below:

On the title page, item [54], and Column 1, line 3:
change "RESULATING" to --RESULTING--.

Signed and Sealed this

Fifteenth Day of September, 1998

Attest:

BRUCE LEHMAN

Attesting Officer        Commissioner of Patents and Trademarks